United States Patent [19]

Su

[11] 4,411,003
[45] Oct. 18, 1983

[54] MULTIPLE-LOOP ADAPTIVE DELTA MODULATOR

[75] Inventor: James C. Su, Bethesda, Md.

[73] Assignee: Communication Satellite Corporation, Washington, D.C.

[21] Appl. No.: 285,244

[22] Filed: Jul. 20, 1981

[51] Int. Cl.³ .......................................... H04B 12/04
[52] U.S. Cl. .................................. 375/33; 332/11 D; 381/32
[58] Field of Search .......... 328/151; 332/11 D, 37 D; 179/15.55 R; 340/347 CC; 375/30, 33, 28

[56] References Cited

U.S. PATENT DOCUMENTS 3,026,375 3/1962 Graham ................................. 375/33
3,746,990 7/1973 Diberder et al. .................... 375/33
3,922,606 11/1975 Nordling ............................. 375/30

Primary Examiner—Benedict V. Safourek
Attorney, Agent, or Firm—Sughrue, Mion, Zinn, Macpeak and Seas

[57] ABSTRACT

An adaptive delta modulator employs an additional feedback loop to produce a more accurate estimate of the input signal. The delta modulated bit stream is applied to a filter having variable filter characteristics such as bandwidth, the output of the filter being combined with the signal estimated by the prior art adaptive delta modulator. The characteristics of the incoming signal, such as bandwidth, are determined by examining the prior art estimated signal, and the filter characteristics of the additional feedback loop are varied in accordance therewith.

4 Claims, 5 Drawing Figures

MULTIPLE-LOOP ADAPTIVE DELTA MODULATOR

BACKGROUND OF THE INVENTION

The present invention relates to the field of delta modulated communications, and more particularly to a system for improving the performance of an adaptive delta modulator.

Digital transmission of speech signals has become increasingly important in communication applications. Standard digital transmission rates for voice channels are typically of 56 or 64 kbps. Techniques which lower the bit rate without a significant loss in speech quality increase the efficiency of the communications channel, and are thus highly desirable.

One of the known techniques for achieving this result is delta modulation. Bit rates as low as 19 kbs have yielded reasonable speech quality using linear delta modulation. However, the quality of the linear delta modulation at such low bit rates is not suitable for commercial telephone usage. Due to the autocorrelative properties of continuously sampled speech signals, the speech signal can be estimated at each sampling instant as a function of the past sample values. Briefly, a delta modulated signal is produced by subtracting the estimated signal sample from the incoming signal sample, and transmitting the error signal in the form of a plus or minus indication (1 or 0). In linear delta modulation, also known as constant DM, the estimated value is obtained from a constant amplitude impulse driving a linear filter. In adaptive modulation, also known as variable slope DM, the estimated value is obtained from a variable amplitude impulse driving a linear filter. The adaptivity of the step size is generally designed so that the error signal is smaller for small signals and larger for large signals.

Because of its fixed step size, the linear delta modulator performs inadequately for commercial telephone transmission purposes, due to its limited dynamic range. The adaptive delta modulators have been developed to improve the dynamic range. One such adaptive delta modulator is fully described in "A Strategy for Delta Modulation in Speech Reconstruction", by J. S. Su et al., *COMSAT Technical Review*, CTR 76/110, Fall 1976, Vol. 6, No. 2, pp. 339–355, the teachings of which are hereby incorporated by reference thereto.

The adaptive delta modulator (ADM) as described in the above article is illustrated in the dashed line portion of FIG. 1, the associated demodulator being illustrated in the dashed line of FIG. 2 as well. The input signal X(t) is compared to the reconstructed signal y(t) in subtractor 10 to produce error signal e(t). The difference or error signal e(t) is sampled at the sampling frequency $f_s$ through a bi-state quantizer 15. The resulting bit stream, B(nT), where T is the sampling period, is applied on the one hand to adaptive step size controller 20, and on the other hand to multiplier 25. The adaptive step size controller 20 observes the bit stream through a window of four to five bits, and determines the suitable step size Q to be used in the delta modulation process. The product output P from the multiplier is applied to feedback filter 30, the output of which is in turn delivered to the inverting input of subtractor 10. The details of the adaptive step size controller, and the characteristics of filter 30 are fully described in detail in the above cited article, and need not be further discussed herein.

With brief reference to FIG. 2, the receiving portion of the communications system employs the delta demodulator. The incoming bit stream B(nT) is applied on the one hand to adaptive step size controller 20', and on the other hand to multiplier 25', to produce signals Q and P, respectively. The signal P is applied to filter 30', which in turn provides an estimated signal to low pass filter 50. The output of low pass filter 50 provides the reconstructed signal output. Elements 20', 25', of FIG. 2, are essentially identical to the associated elements 20, 25, and 30 of FIG. 1. Additionally, the adaptive delta modulator and demodulator of FIGS. 1 and 2 may be implemented entirely digitally or may comprise a combination of digital and analog components.

Although the adaptive delta modulators have improved the dynamic range of the delta modulation process, the adaptive delta modulators known in the art either suffer from blurring of speech quality, or experience weakness in resistance to transmission errors.

SUMMARY OF THE INVENTION

The present invention avoids the shortcomings associated with the prior art delta modulation techniques in order to maintain high fidelity, crisp articulation, and high resistance to transmission errors, while requiring relatively low bit rates.

The delta modulator in accordance with the present invention employs a multiple feedback loop technique, and consists of a regular adaptive delta modulator, in further combination with a statistical analyzer and parameter controller which controls the additional feedback loop. The present invention may be employed for use in high quality telephone speech signals, sinusoidal, PSK or FSK data signals, as well as other types of signals.

DETAILED DESCRIPTION OF THE PRESENT INVENTION

Figure 1:
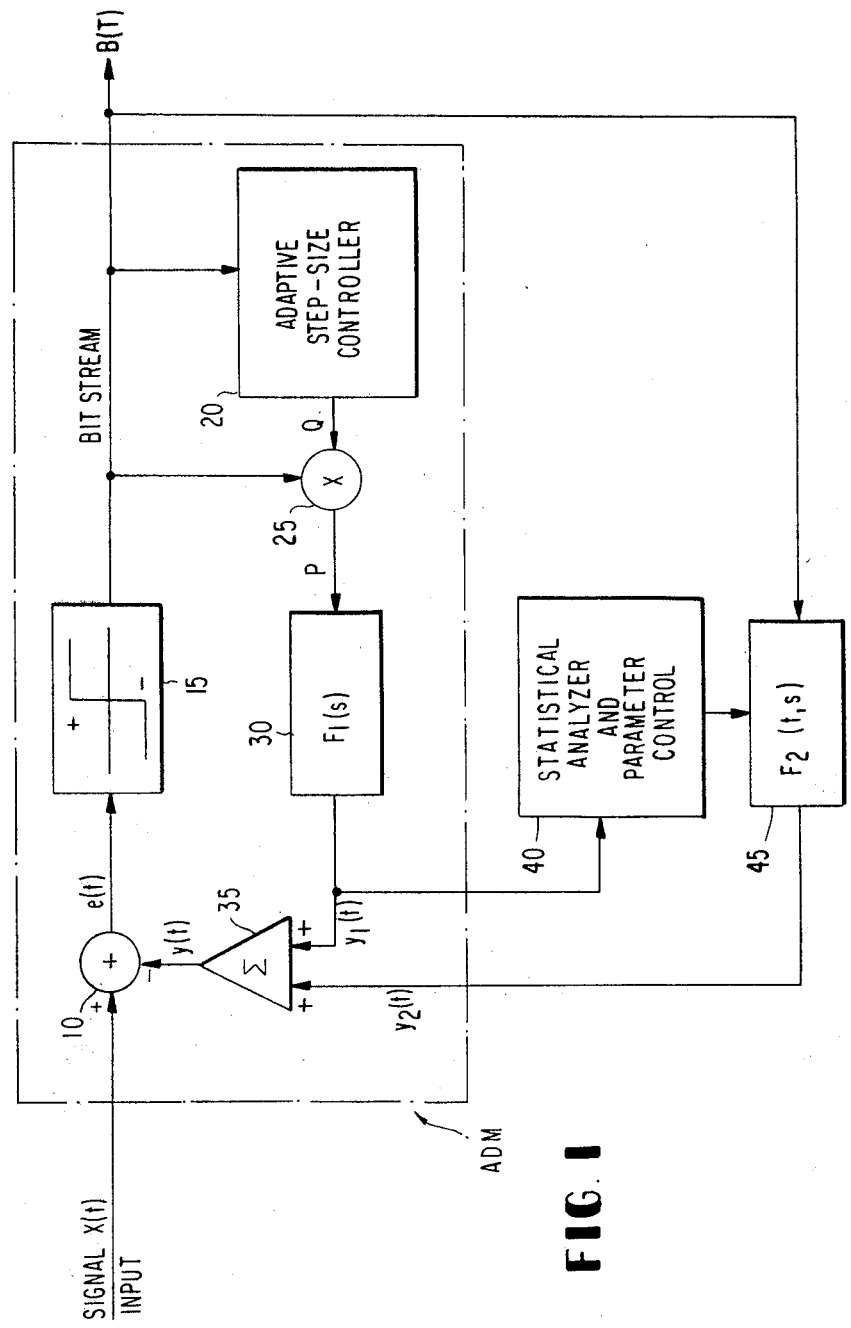
FIG. 1 is a block diagram of the multiple loop adaptive delta modulator in accordance with the present invention.
Figure 2:
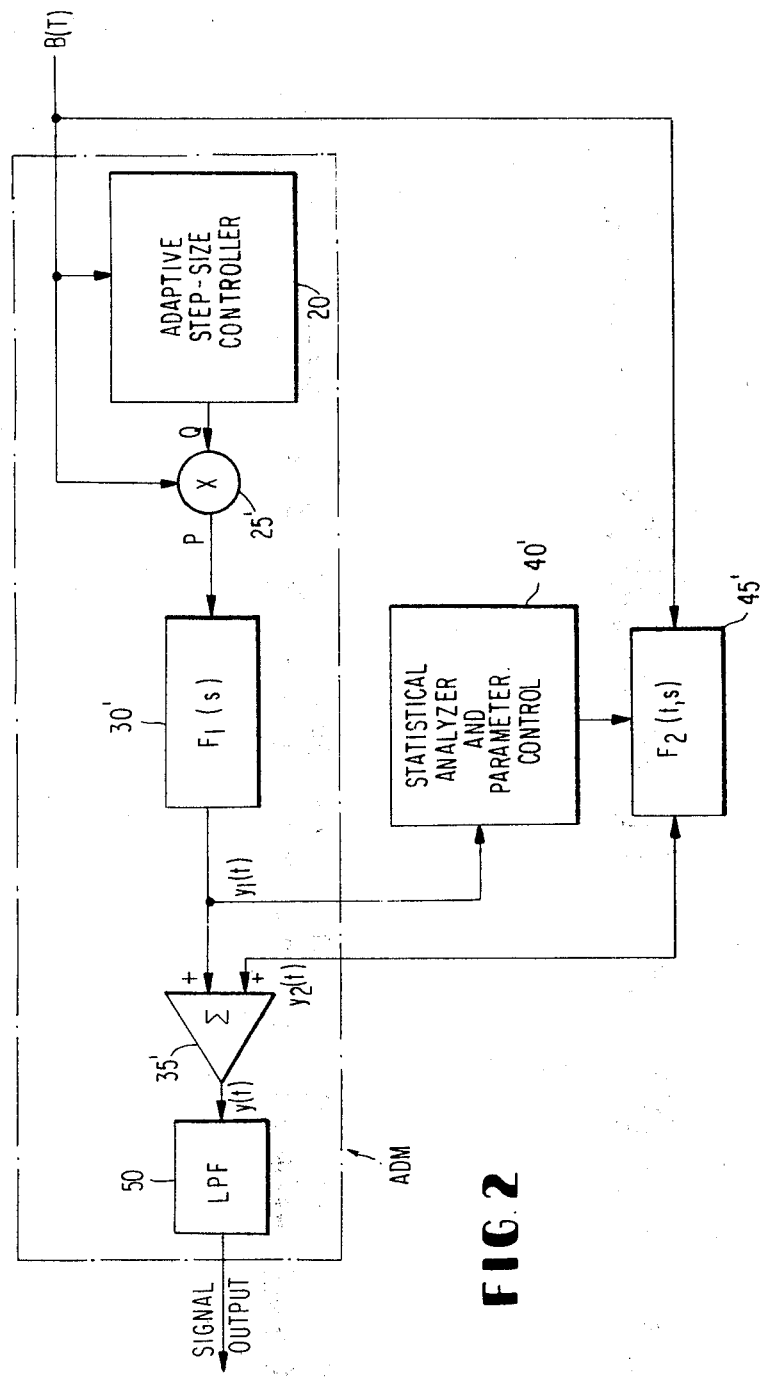
FIG. 2 is a block diagram of the multiple loop delta demodulator in accordance with the present invention.

With reference to FIG. 1, the multiple loop adaptive delta modulator in accordance with the present invention utilizes the well known adaptive delta modulator identified within the dashed lines in the Figure. An additional feedback loop is provided in order to provide a better estimate y(t) of the input signal X(t). The output bit stream B(nT) is applied to feedback loop filter 45, the output of which is applied to summation device 35, the other input of which receives the output of the first feedback loop filter 30. The outputs $y_1(t)$ and $y_2(t)$ from feedback loop filters 30 and 45 are combined in summation device 35 to produce the overall signal estimate y(t). The output of filter 30 is applied to statistical analyzer and parameter control device 40 which adjusts the characteristics of filter 45 in accordance with the signal $y_1(t)$. The output $y_1(t)$ of filter 30, rather than signal X(t), is used in analyzer 40 since the associated signal $y_1(t)$ from filter 30' is available at the receiver (FIG. 2), while input signal X(t) is not.

Briefly, by providing a closer estimate of the input signal X(t), the fidelity of the restored signal and the resistance to transmission errors may be greatly increased. Since the characteristics of speech vary widely and rapidly depending upon whether consonants or vowels are being spoken, and also vary depending upon the particular speaker, and since the characteristics of filter 30 are fixed, the ability of the signal y(t) to emulate the input signal X(t) is inherently limited. Thus, by providing an additional feedback path through filter 45, and by controlling the characteristics of the filter 45 in accordance with the input signal, or the estimate thereof, a closer approximation of the input signal can be achieved. In particular, the bandwidth of the filter 45 should be reduced in response to the reception of a band limited speech signal, while the bandwidth of filter 45 should be increased for the reception of a broad band speech signal.

The following is an analysis and design implementation of one particular type of statistical analyzer and parameter control 40 and adjustable parameter filter 45. Other implementations which provide the same result as that described below will become apparent to one skilled in the art.

The power spectra or bandwidth of the input signal can be determined statistically from an examination of autocorrelation functions R(t;τ), where t represents time and τ represents time displacement. For example, when R(t;τ) (for t=constant) has a high autocorrelation value, it implies that the speech burst has a dominating narrow bandwidth, such as with vowels. Conversely, when R(t;τ) (for t=constant) has a low autocorrelation value, it implies that the speech burst has a dominating wider bandwidth, such as with consonants. Furthermore, the autocorrelation R(t;τ) for large values of τ provides a better indication of the lower frequency contents of the speech signal, while smaller values of τ provide a better indication of the higher frequency components in the speech signal.

Figure 3:
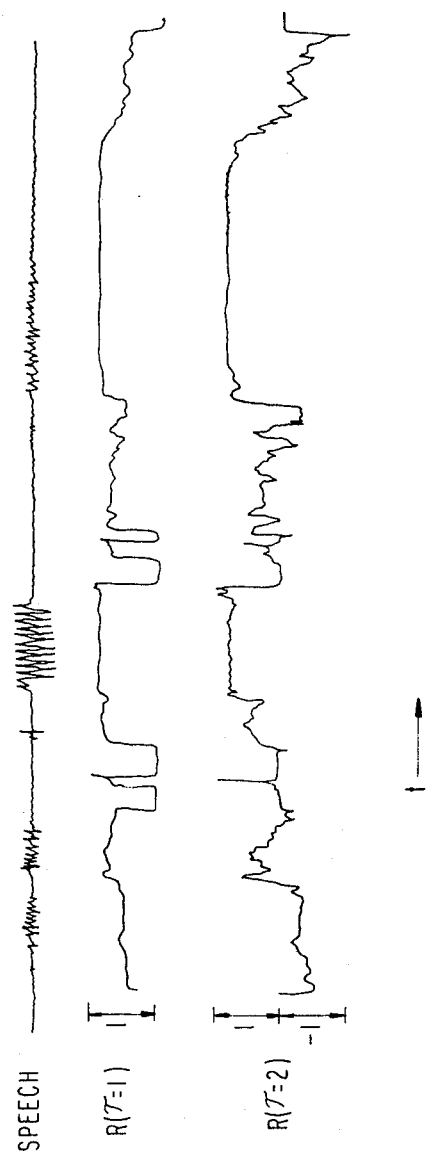
FIG. 3 illustrates a speech signal and its first two values of autocorrelation function.

FIG. 3 illustrates a segment of samples for R(t,1) and R(t,2) and the corresponding speech sample. It can be seen that the rates of change of R(t,1) and R(t,2) are slow and are comparable to the syllabic rate. Therefore, when R(t,1) and R(t,2) are used for controlling the adaptive filter parameters, the adaptive rate of the filter will also be syllabically slow. It is principally this mechanism which makes the multiple loop adaptive delta modulator in accordance with the present invention strong in resistance to transmission errors, due to the slow adaptivity, while maintaining articulate speech quality.

Table 1 is a statistical distribution of a number of speech samples for the two autocorrelation functions, $R(\tau=1)$, and $R(\tau=2)$, where t=constant.

TABLE 1

FREQUENCY DISTRIBUTION OF $(R_1, R_2)$

|  |  | $R(\tau = 2)$ | | | | | | | | | | | | | | | | | | | | |
|---|---|---|---|---|---|---|---|---|---|---|---|---|---|---|---|---|---|---|---|---|---|
|  |  | −1.0 | −.9 | −.8 | −.7 | −.6 | −.5 | −.4 | −.3 | −.2 | −.1 | .0 | .1 | .2 | .3 | .4 | .5 | .6 | .7 | .8 | .9 | .10 |
| | .0 | 10 | 54 | 29 | 19 | 18 | 10 | 19 | 14 | 10 | 15 | 1549 | 1 | 0 | 0 | 2 | 3 | 1 | 0 | 0 | 0 | 0 |
| | .1 | 0 | 3 | 12 | 22 | 72 | 70 | 40 | 31 | 19 | 19 | 2 | 4 | 3 | 0 | 0 | 0 | 1 | 1 | 0 | 0 | 0 |
| | .2 | 4 | 5 | 9 | 5 | 15 | 142 | 519 | 301 | 56 | 36 | 2 | 1 | 2 | 3 | 1 | 1 | 1 | 0 | 1 | 0 | 0 |
| | .3 | 3 | 1 | 3 | 3 | 3 | 14 | 285 | 1404 | 1406 | 310 | 22 | 14 | 10 | 7 | 3 | 2 | 0 | 1 | 1 | 0 | 0 |
| | .4 | 1 | 3 | 3 | 2 | 0 | 2 | 6 | 62 | 637 | 2996 | 361 | 51 | 25 | 10 | 6 | 1 | 2 | 3 | 0 | 0 | 0 |
| $R(\tau = 1)$ | .5 | 3 | 1 | 2 | 2 | 1 | 0 | 0 | 2 | 3 | 777 | 942 | 1496 | 691 | 76 | 29 | 6 | 4 | 4 | 0 | 1 | 1 |
| | .6 | 0 | 3 | 3 | 1 | 1 | 3 | 3 | 1 | 1 | 11 | 25 | 142 | 1341 | 1542 | 663 | 63 | 13 | 4 | 0 | 1 | 0 |
| | .7 | 1 | 1 | 1 | 3 | 0 | 1 | 1 | 1 | 3 | 2 | 2 | 4 | 8 | 236 | 724 | 1167 | 986 | 77 | 11 | 3 | 0 |
| | .8 | 1 | 2 | 1 | 2 | 2 | 1 | 0 | 0 | 2 | 4 | 2 | 1 | 1 | 6 | 8 | 20 | 26 | 643 | 7839 | 2112 | 20 |
| | .9 | 11 | 6 | 7 | 11 | 7 | 2 | 2 | 0 | 4 | 1 | 0 | 0 | 2 | 1 | 2 | 2 | 3 | 6 | 25 | 41 | 0 |
| | 1.0 | 0 | 0 | 0 | 0 | 0 | 0 | 0 | 0 | 0 | 0 | 0 | 0 | 0 | 0 | 0 | 0 | 0 | 0 | 0 | 10 | 0 |

The designations τ=1 and τ=2 refer to one and two sampling periods, respectively. Table 1 is produced as follows. The two functions $R_1$ and $R_2$ are measured for an arbitrarily large number of speech samples. The measured values are normalized to a maximum of 1.0 by dividing by $R_o(\tau=0)$: the normalized values of $R_1$ and $R_2$ are then plotted against each other as shown, to indicate frequencies of occurrance.

Three partitions as shown in Table 1 are chosen. The first block (solid line) is composed of relatively high values of $(R_1, R_2)$, which correspond to the narrow banded vowels. The second block shown in a dashed line corresponds to transition sounds from vowels to consonants, or vice versa. Finally, the remaining portion of the distribution corresponds to consonants, system noise and silent speech portions.

The partitions shown in Table 1 were not chosen on an arbitrary basis. Rather, the first and second blocks constitute 54.376% of the total sample population, while the remaining portion obviously occupying the remaining population. The breakdown between the vowel and consonant portions of speech was thus chosen to be very close to the speech model developed by W. B. Davenport, Jr., "An Experimental Study of Speech Wave Probability Distributions", *Journal of the Accoustical Society of America*, Vol. 24, No. 4, July 1952, pp. 390-399. Again, other choices may be made to produce substantially the same result. Further, the particular choices will eminently be influenced by the particular speech samples utilized to produce the distribution such as that shown in Table 1.

Filters 45 and 45' in accordance with the present invention may comprise the following filter structure which has been found to exhibit acceptable stability properties.

$$F_2(t;s) = \frac{1 - b_1(t)Z^{-1}}{1 - a_1(t)Z^{-1} - a_2(t)Z^{-2}} \quad (1)$$

where $b_1(t)$, $a_1(t)$ and $a_2(t)$ are time varying constant parameters, and where z is a z-transform variable. Theoretically, $b_1(t)$, $a_1(t)$, and $a_2(t)$, can be an infinite set of variables due to the infinite variety of speech patterns. For practical purposes however three sets of $a_1(t)$ and $a_2(t)$ were used, while $b_1(t)$ was chosen to be a constant approximately equal to 0.5.

The three pairs of ($a_1$, $a_2$) used in simulation studies are as follows:

First pair: $(a_1, a_2) = (0.963, -0.14)$     (2)

Second pair: $(a_1, a_1) = (0.963, -0.09)$     (3)

Third pair: $(a_1, a_2) = (0.87, -0.54)$     (4)

These three pairs were designed to match the filter bandwidth to the current bandwidth of the speech signal, were obtained by trial and error involving computer simulation, eye smoothing techniques and frequency spectrum matching techniques, and correspond to the three classes of speech, namely vowels, consonants, and transitions between vowels and consonants. The ability to use other parameter pairs is readily evident to one skilled in the art, the particular values employed depending upon the particular speech quality, and the particular filter design. In fact, reasonable results can be achieved by using fewer or more than three parameter pairs, for fewer or greater than three speech classes. Again, the choice of the filter characteristics and the controlled parameters as outlined above are merely illustrated herein as an example of a workable system. Other filter characteristics and parameter controls will become apparent to one skilled in the art.

Thus, by detecting the two autocorrelation functions ($R_1$ and $R_2$), the particular speech classification can be determined. In response to the speech classification, the parameters $a_1$ and $a_2$ may be generated to provide the overall frequency characteristic of filters 45 and 45', in particular the bandwidths thereof.

Figure 4:
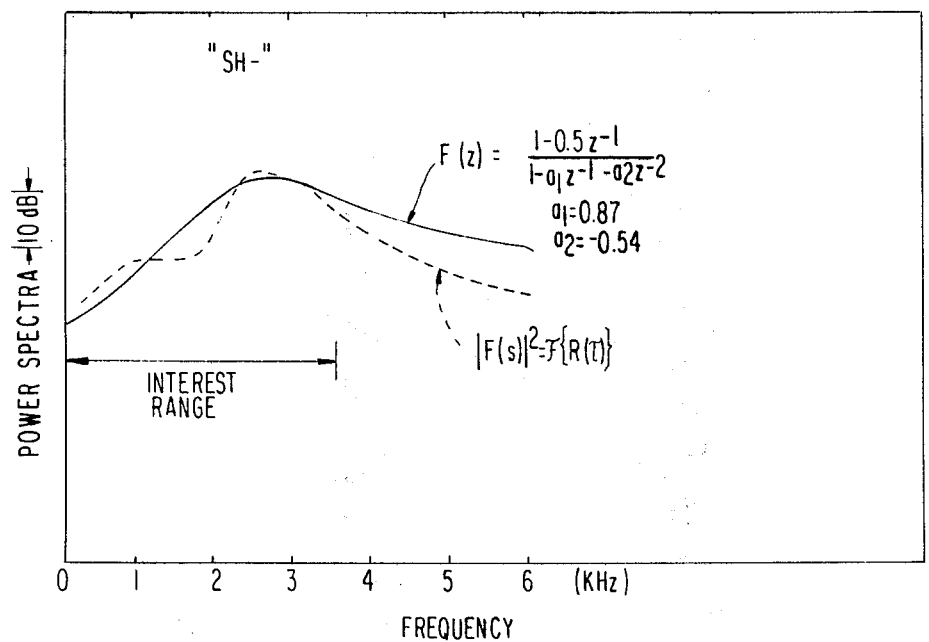
FIG. 4 is an illustration of the spectral matching of filter 45, FIG. 1, or 45', FIG. 2, with a speech burst.

FIG. 4 compares the power spectrum for the speech signal produced by the sound "SH-", and the filter characteristic for the parameters $a_1$ and $a_2$ chosen for the consonants. A relatively good match in bandwidths is evident.

Figure 5:
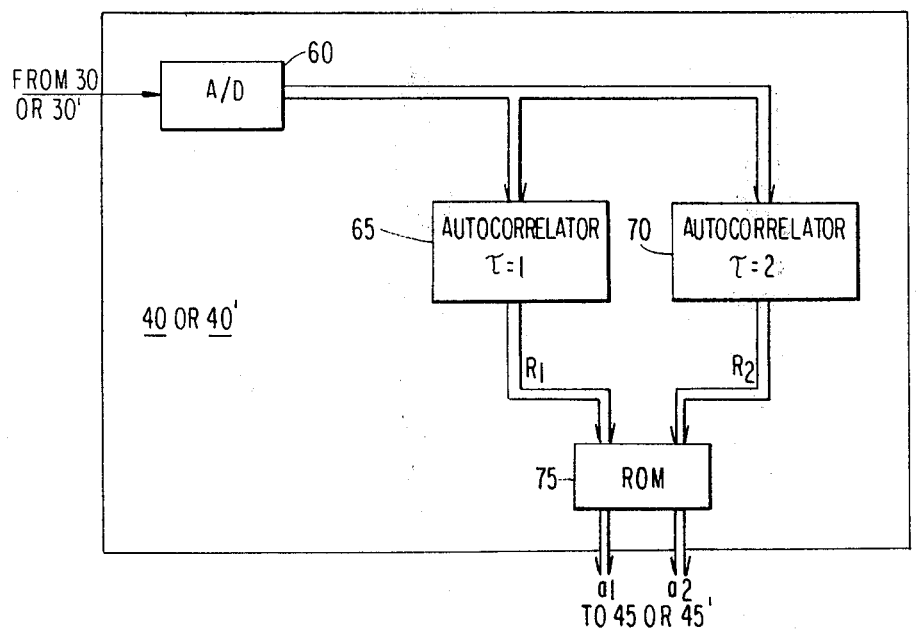
FIG. 5 is an illustration of the details of the statistical analyzer and parameter control 40 or 40', FIGS. 1 or 2, respectively.

FIG. 5 illustrates one implementation of the statistical analyzer and control device 40 or 40'. The signal $y_1(t)$ is applied from filter 30 or 30' to a A/D converter 60, if the filter 30 or 30' provides an analog signal. Again, the use of analog or digital implementation at various signal processing points is a matter of choice as is apparent to one skilled in the art. The signal $y_1$ is applied to first and second autocorrelators 65 and 70, each of which produce the normalized autocorrelation functions $R_1$ and $R_2$, for $\tau = 1$ and $t = 2$, respectively. The autocorrelation functions $R_1$ and $R_2$ are applied to read only memory 75. Read only memory 75 is programmed in a well known manner to provide three pairs of values ($a_1$, $a_2$) depending the values of $R_1$, and $R_2$, in accordance with the partitions chosen in Table 1, and in accordance with the selected filter characteristics. The values of $a_1$ and $a_2$ are applied directly to digital filter 45 or 45', which may be constructed in a well known manner in accordance with equation (1) using a microprocessor or discrete digital components.

The operation of the receiver demodulator is identically the same of that of the transmitter modulator except that the input is the bit stream B(nT). A low pass filter 50 is added to smooth the reconstructed signal y(t).

Extensive computer simulations at low bit rates from 32 KBS to 12 KBS were conducted using telephone speech as the input signal. The results indicate that the multiple loop adaptive delta modulator in accordance with the present invention produces high quality telephone speech. More importantly, the new device exhibits strong resistance to transmission errors, and as such represents a significant improvement over the prior art adaptive delta modulator.

Additionally, listener preference tests were performed with excellent results. Test subjects agreed that the quality of the reconstructed speech was very clear and articulate. A 16 kbs reconstructed telephone speech signal with different error rates was demonstrated with great success. High intelligibility was upheld at 16 kbs with an error rate as high as $10^{-2}$.

Various changes, additions and omissions of elements may be made within the scope and spirit of the present invention. It is to be understood that the invention is not limited to the specific details, examples and preferred embodiments shown and described herein.

What is claimed is:

1. An adaptive delta modulator for producing a delta-modulated bit stream in response to an input signal, comprising:

subtracting means, said input signal being applied to a first input of said subtracting means;

quantizing means receiving an output of said subtracting means, said delta-modulated bit stream being produced at an output of said quantizing means;

first feedback means comprising an adaptive step size controller for producing in response to a plurality of sequential bits of said delta-modulated bit stream output from said quantizer a signal representing a step size, multiplier means for multiplying said delta-modulated bit stream output by said signal representing said step size, and first filter means having an input coupled to a product output of said multiplying means; and second feedback means comprising means for detecting a bandwidth of a predetermined one of an output of said first filter means and said input signal, and second filter means having an input coupled to said delta-modulated bit stream output and having a bandwidth determined in accordance with an output of said bandwidth detecting means; and signal summing means receiving inputs from said output of said first filter means and an output of said second filter means, an output of said signal summing means being applied to a second input of said subtracting means.

2. The adaptive delta modulator of claim 1, wherein said bandwidth detecting means comprises autocorrelation determining means having an input coupled to said output of said first filter.

3. The adaptive delta modulator of claim 2, wherein said bandwidth detecting means further comprises a read-only memory having stored therein data representative of digital filter control parameters as a function of an autocorrelation function of said output of said first filter, and wherein said second filter means comprises a digital filter having filter parameters set by an output of said read-only memory.

4. The adaptive delta modulator of claim 3, wherein said autocorrelation determining means comprises first and second autocorrelators, both having inputs coupled to said output of said first filter, said first and second autocorrelators having different autocorrelation delay times, outputs of said first and second autocorrelators being applied to address inputs of said read-only memory.

* * * * *

UNITED STATES PATENT AND TRADEMARK OFFICE
CERTIFICATE OF CORRECTION

PATENT NO. : 4,411,003
DATED : October 18, 1983
INVENTOR(S) : JAMES C. SU

It is certified that error appears in the above-identified patent and that said Letters Patent is hereby corrected as shown below:

Column 4, line 29, after "of" delete "occurrance" insert --occurrence--.

Column 5, line 59, after "same" delete "of" insert --as--.

Signed and Sealed this

Fifth Day of June 1984

[SEAL]

Attest:

GERALD J. MOSSINGHOFF

Attesting Officer

Commissioner of Patents and Trademarks